(12) United States Patent
Wang et al.

(10) Patent No.: US 8,555,492 B2
(45) Date of Patent: Oct. 15, 2013

(54) METHOD FOR MANUFACTURING A CONDUCTIVE SUBSTRATE STRUCTURE WITH CONDUCTIVE CHANNELS FORMED BY USING A TWO-SIDED CUT APPROACH

(75) Inventors: Bily Wang, Hsinchu (TW); Sung-Yi Hsiao, Miaoli County (TW); Jack Chen, Miaoli County (TW)

(73) Assignee: Harvatek Corporation, Hsinchu (TW)

( * ) Notice: Subject to any disclaimer, the term of this patent is extended or adjusted under 35 U.S.C. 154(b) by 29 days.

(21) Appl. No.: 13/338,410

(22) Filed: Dec. 28, 2011

(65) Prior Publication Data

US 2012/0096710 A1 Apr. 26, 2012

Related U.S. Application Data

(62) Division of application No. 12/649,824, filed on Dec. 30, 2009, now Pat. No. 8,263,876.

(51) Int. Cl.
*H05K 3/04* (2006.01)

(52) U.S. Cl.
USPC ............... 29/847; 29/846; 438/113; 438/460; 438/462

(58) Field of Classification Search
USPC ................. 29/620, 621, 847, 852; 438/410, 438/460–465
See application file for complete search history.

(56) References Cited

U.S. PATENT DOCUMENTS

| | | | | |
|---|---|---|---|---|
| 4,961,821 A * | 10/1990 | Drake et al. | ..................... | 438/21 |
| 5,020,212 A * | 6/1991 | Michijima et al. | ......... | 29/603.13 |
| 5,166,097 A * | 11/1992 | Tanielian | ...................... | 438/667 |
| 5,825,076 A * | 10/1998 | Kotvas et al. | ................. | 257/622 |
| 6,348,363 B1 * | 2/2002 | Chung et al. | ................. | 438/106 |
| 6,391,685 B1 * | 5/2002 | Hikita et al. | .................. | 438/113 |
| 7,820,484 B2 * | 10/2010 | Chua et al. | .................... | 438/109 |
| 7,877,874 B2 * | 2/2011 | Val | ................................. | 29/852 |
| 2005/0181573 A1 * | 8/2005 | Yamasaki et al. | ............ | 438/386 |
| 2006/0223228 A1 * | 10/2006 | Kong | ................ | 438/106 |
| 2007/0197001 A1 * | 8/2007 | Luh et al. | ...................... | 438/458 |
| 2010/0081256 A1 * | 4/2010 | Uemura et al. | ............... | 438/462 |
| 2012/0025354 A1 * | 2/2012 | Sasaki et al. | .................. | 257/620 |

* cited by examiner

*Primary Examiner* — Peter DungBa Vo
*Assistant Examiner* — Kaying Kue
(74) *Attorney, Agent, or Firm* — Rosenberg, Klein & Lee

(57) ABSTRACT

A conductive substrate structure includes a substrate unit, a conductive pad unit, and a conductive layer unit. The substrate unit has a top surface, a bottom surface, two opposite lateral surfaces, and a front surface. The conductive pad unit has at least two first conductive pads separated from each other and disposed on the top surface, and at least two second conductive pads separated from each other and disposed on the bottom surface. The conductive layer unit has at least two first conductive layers formed on the front surface and respectively electrically connected to two front sides of the two first conductive pads, and at least two second conductive layers respectively formed on the two opposite lateral surfaces and respectively electrically connected to two opposite lateral sides of the two second conductive pads. The two first conductive layers are respectively electrically connected with the two second conductive layers.

4 Claims, 10 Drawing Sheets

METHOD FOR MANUFACTURING A CONDUCTIVE SUBSTRATE STRUCTURE WITH CONDUCTIVE CHANNELS FORMED BY USING A TWO-SIDED CUT APPROACH

RELATED APPLICATIONS

This application is a Divisional patent application of application Ser. No. 12/649,824, filed on 30 Dec. 2009, U.S. Pat. No. 8,263,876. The entire disclosure of the prior application Ser. No. 12/649,824, from which an oath or declaration is supplied, is considered a part of the disclosure of the accompanying Divisional application and is hereby incorporated by reference.

BACKGROUND OF THE INVENTION

1. Field of the Invention

The present invention relates to a conductive substrate structure and a method for manufacturing the same, in particular, to a conductive substrate structure with conductive channels formed by using a two-sided cut approach and a method for manufacturing the same.

2. Description of Related Art

A substrate has top circuits on its top surface and bottom circuits on its bottom surface, wherein the top circuits are electrically connected to the bottom circuits by using conductive holes. The method of the prior art for manufacturing the conductive holes is that: forming a plurality of through holes on the substrate by laser or machine to drill through the substrate, and then filling conductive material into the through holes to complete the conductive holes in order to electrically connect the top circuits and the bottom circuits of the substrate.

SUMMARY OF THE INVENTION

In view of the aforementioned issues, the present invention provides a conductive substrate structure with conductive channels formed by using a two-sided cut approach and a method for manufacturing the same. The present invention has a plurality of openings passing through a substrate, and the openings are formed by cutting two surfaces of the substrate.

To achieve the above-mentioned objectives, the present invention provides a conductive substrate structure with conductive channels formed by using a two-sided cut approach, including: a substrate unit, a conductive pad unit, and a conductive layer unit. The substrate unit has a top surface, a bottom surface opposite to the top surface, two opposite lateral surfaces between the top surface and the bottom surface, and a front surface between the top surface and the bottom surface and on two front sides of the two lateral surfaces. The conductive pad unit has at least two first conductive pads separated from each other and disposed on the top surface of the substrate unit, and at least two second conductive pads separated from each other and disposed on the bottom surface of the substrate unit. The conductive layer unit has at least two first conductive layers formed on the front surface of the substrate unit and respectively electrically connected to two front sides of the two first conductive pads, and at least two second conductive layers respectively formed on the two opposite lateral surfaces of the substrate unit and respectively electrically connected to two opposite lateral sides of the two second conductive pads. The two first conductive layers are respectively electrically connected with the two second conductive layers.

To achieve the above-mentioned objectives, the present invention provides a method for manufacturing conductive substrate structures with conductive channels formed by using a two-sided cut approach. The method includes providing a substrate unit, and the substrate unit having a plurality of first conductive pads separated from each other and disposed on a top surface thereof, and a plurality of second conductive pads separated from each other and disposed on a bottom surface thereof; cutting the top surface of the substrate unit to form a plurality of first grooves on the top surface of the substrate unit; cutting the bottom surface of the substrate unit to form a plurality of second grooves on the bottom surface of the substrate unit, and each first groove and each second groove being joined with each other to form an opening; forming a conductive material in the first grooves, the second grooves, and the openings; removing one part of the conductive material in the first grooves; and than cutting the substrate unit along the first grooves and the second grooves so as to form the conductive substrate structures.

Therefore, the method of using laser or machine to drill through a substrate to form a plurality of through holes according to the prior art is replaced by the method of cutting the substrate unit to form the openings according to the present invention.

In order to further understand the techniques, means, and effects the present invention takes for achieving the prescribed objectives, the following detailed descriptions and appended drawings are hereby referred; such that, through which the purposes, features, and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 1:
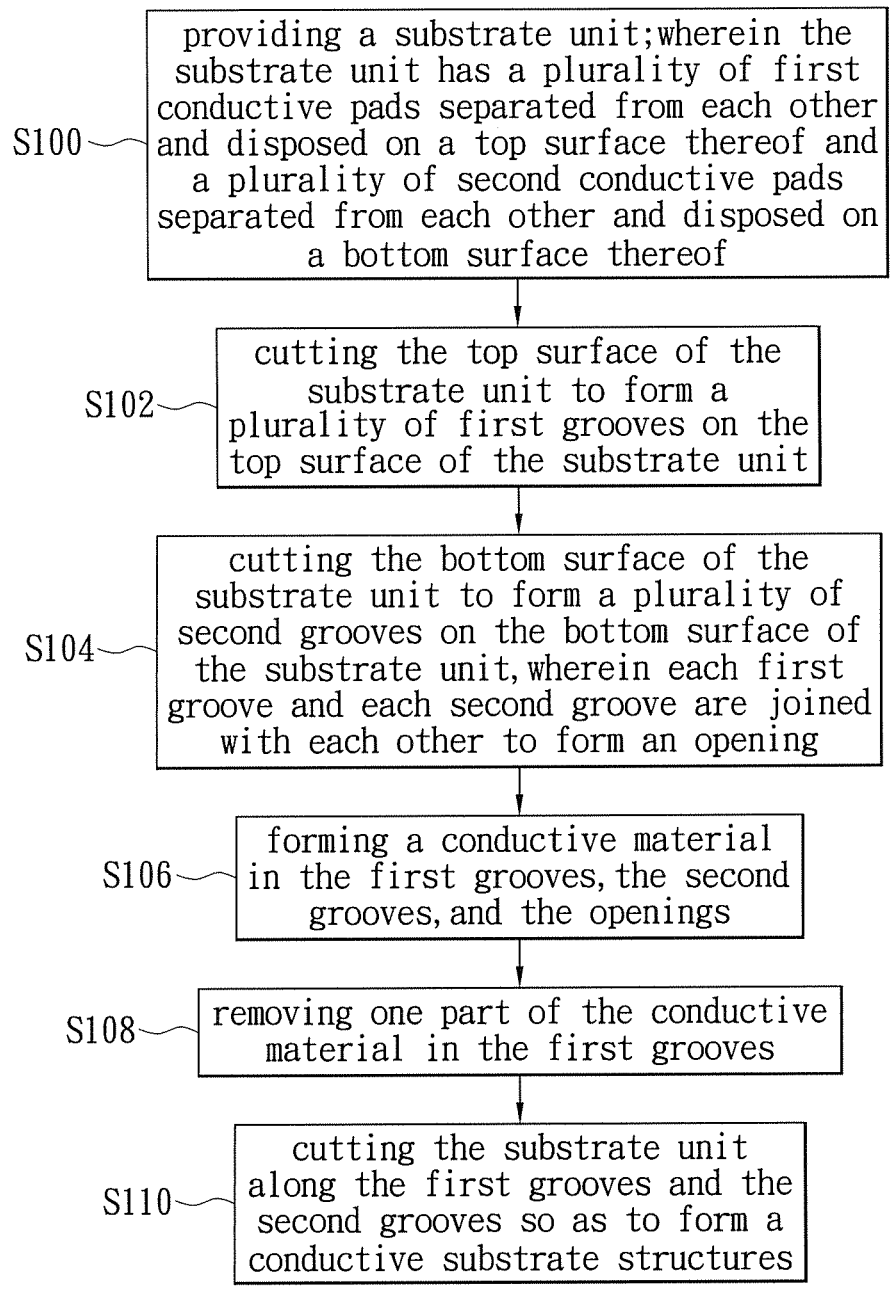
FIG. 1 is a flowchart of the method for manufacturing conductive substrate structures with conductive channels formed by using a two-sided cut approach according to the present invention.

Referring to FIG. 1, the present invention provides a method for manufacturing conductive substrate structures with conductive channels formed by using a two-sided cut approach. The method includes providing a substrate unit (the substrate unit has a plurality of first conductive pads separated from each other and disposed on a top surface thereof and a plurality of second conductive pads separated from each other and disposed on a bottom surface thereof); cutting the top surface of the substrate unit to form a plurality of first grooves on the top surface of the substrate unit; cutting the bottom surface of the substrate unit to form a plurality of second grooves on the bottom surface of the substrate unit, and each first groove and each second groove are joined with each other to form an opening; forming a conductive material in the first grooves, the second grooves, and the openings; removing one part of the conductive material in the first grooves; and then cutting the substrate unit along the first grooves and the second grooves to form the conductive substrate structures.

Figure 2:
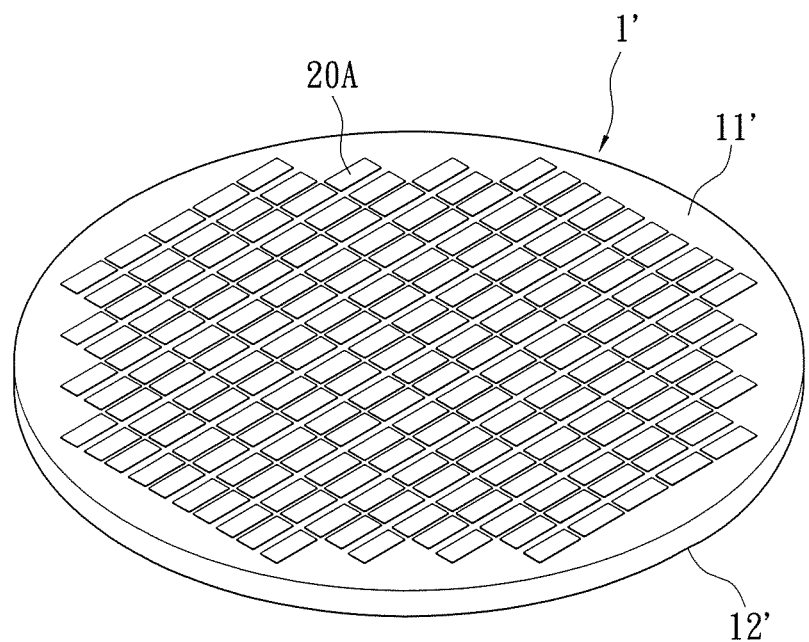
FIGS. 2 to 8B are schematic views of the conductive substrate structure with conductive channels formed by using a U-cutting tool according to the present invention, at different stages of the manufacturing processes, respectively.

Referring to FIGS. 2 to 8B, the present invention has the follow detail manufacturing processes:

The step S100 is that: referring to FIGS. 1 and 2, providing a substrate unit 1' that has a plurality of first conductive pads 20A separated from each other and disposed on a top surface 11' thereof and a plurality of second conductive pads 20B separated from each other and disposed on a bottom surface 12' (as shown in FIG. 2) thereof. The positions and the number of the first conductive pads 20A respectively correspond to the positions and the number of the second conductive pads 20B. In addition, the substrate unit can be a wafer, a printed circuit board, or a substrate made of any insulative material.

Figure 3A:
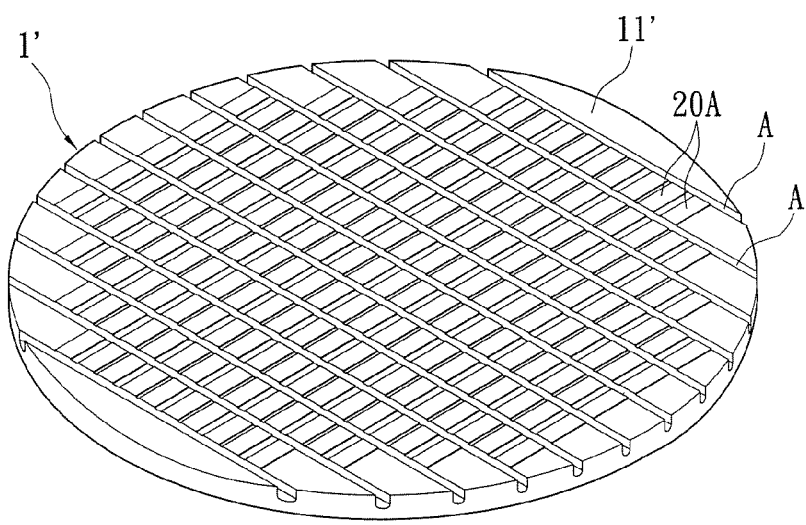
Figure 3B:
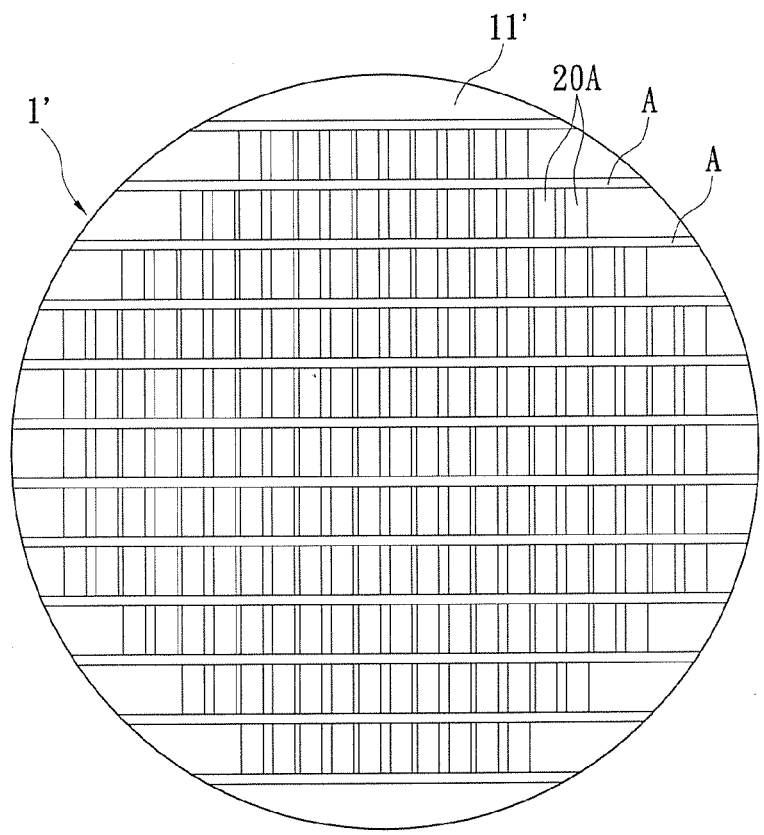

The step S102 is that: referring to FIGS. 1, 3A, and 3B, cutting the top surface 11' of the substrate unit 1' by using a U-cutting tool to form a plurality of first grooves A with U shape on the top surface 11' of the substrate unit 1'. In addition, the depth of each first groove A is larger than ½ thickness of the substrate unit 1', and the first grooves A are respectively formed on two lateral sides of each row of the first conductive pads 20A.

Figure 4A:
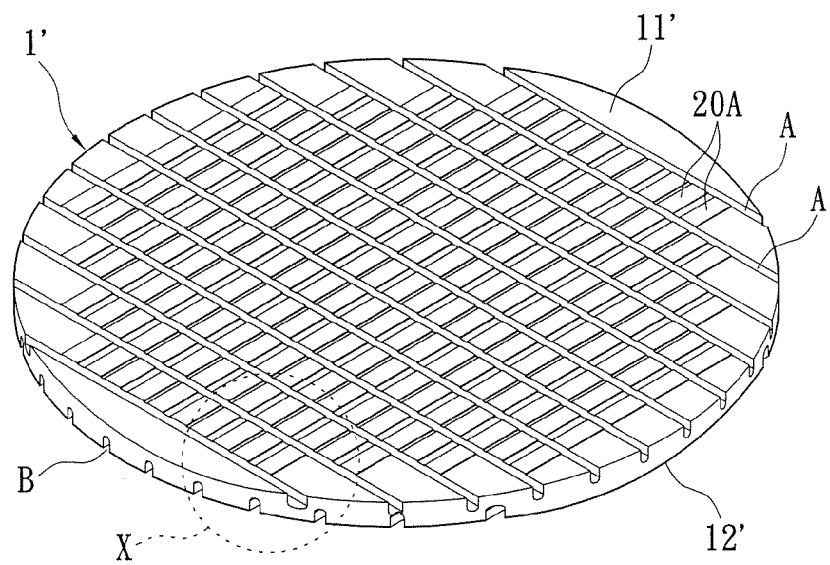
Figure 4B:
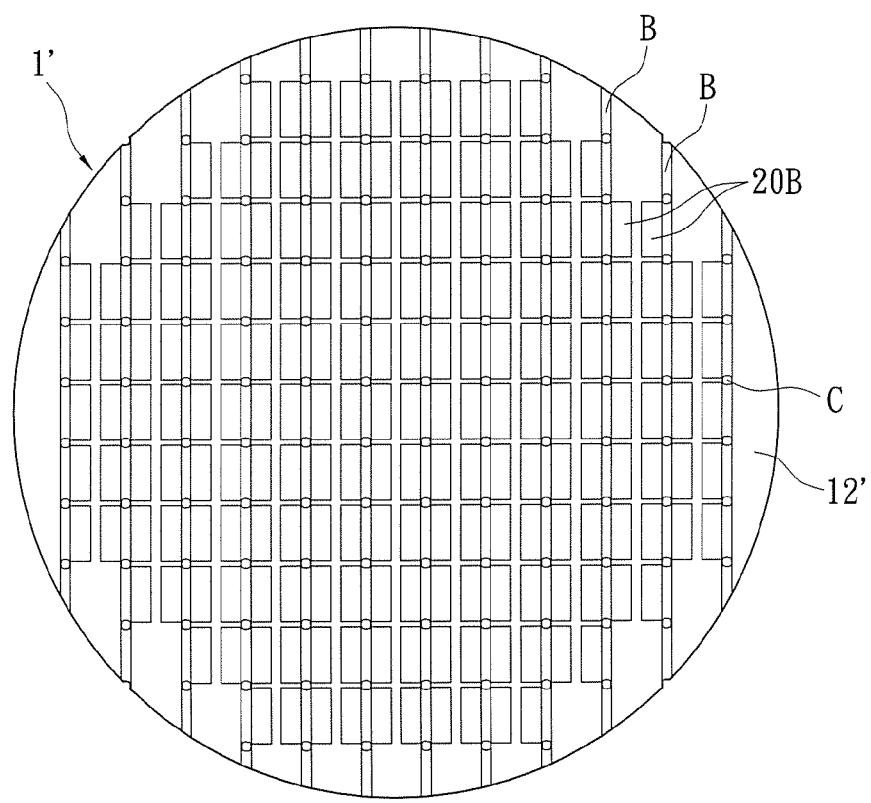

The step S104 is that: referring to FIGS. 1, 4A, and 4B (FIG. 4B is a bottom diagram of FIG. 4A), cutting the bottom surface 12' of the substrate unit 1' by using a U-cutting tool to form a plurality of second grooves B with U shape on the bottom surface 12' of the substrate unit 1', and each first groove A and each second groove B are joined with each other to form an opening C (as shown in FIG. 4B). In addition, the depth of each second groove B is larger than ½ thickness of the substrate unit 1', and the second grooves B are respectively formed on two lateral sides of every two rows of the second conductive pads 20B.

Figure 5A:
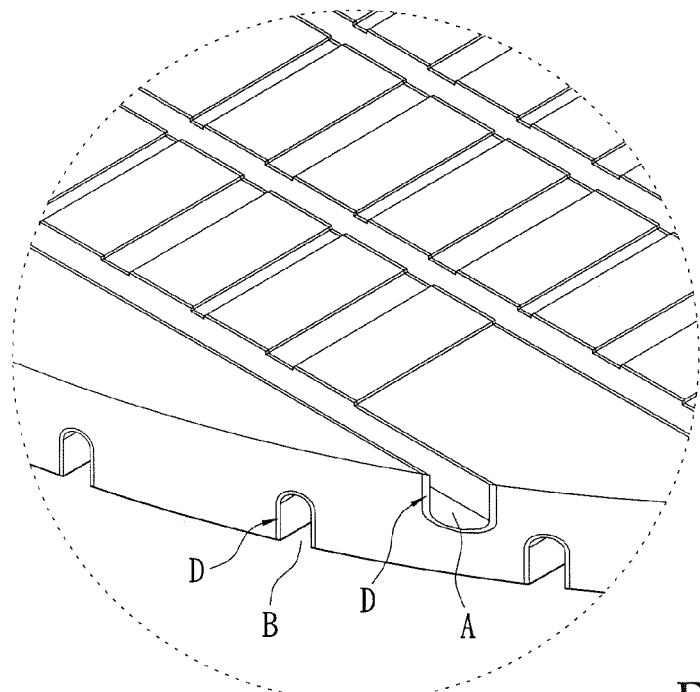
Figure 5B:
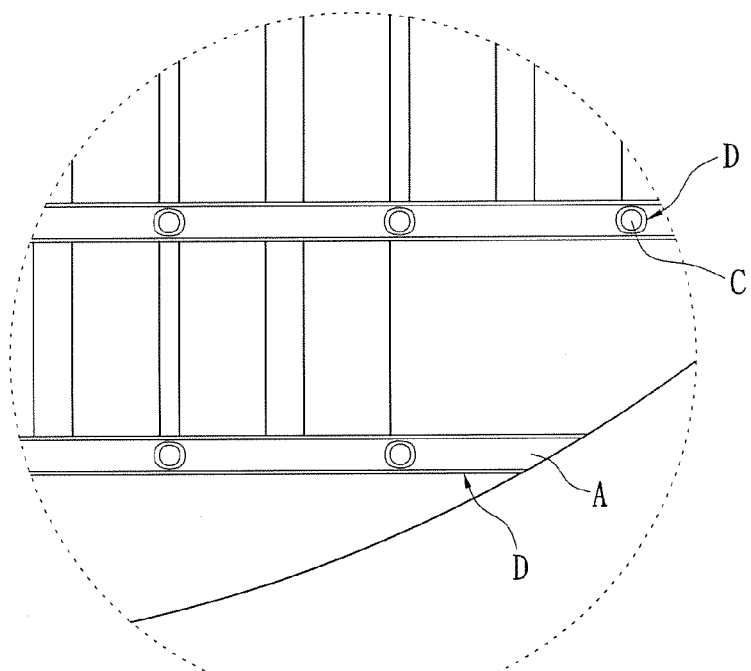

The step S106 is that: referring to FIGS. 1, 5A, and 5B (FIG. 5A shows an enlarged view of X part of FIG. 4A, and FIG. 5B is a bottom diagram of FIG. 5A), forming a conductive material D in the first grooves A, the second grooves B, and the openings C by electroplating, evaporating, sputtering, or any forming method.

Figure 6:
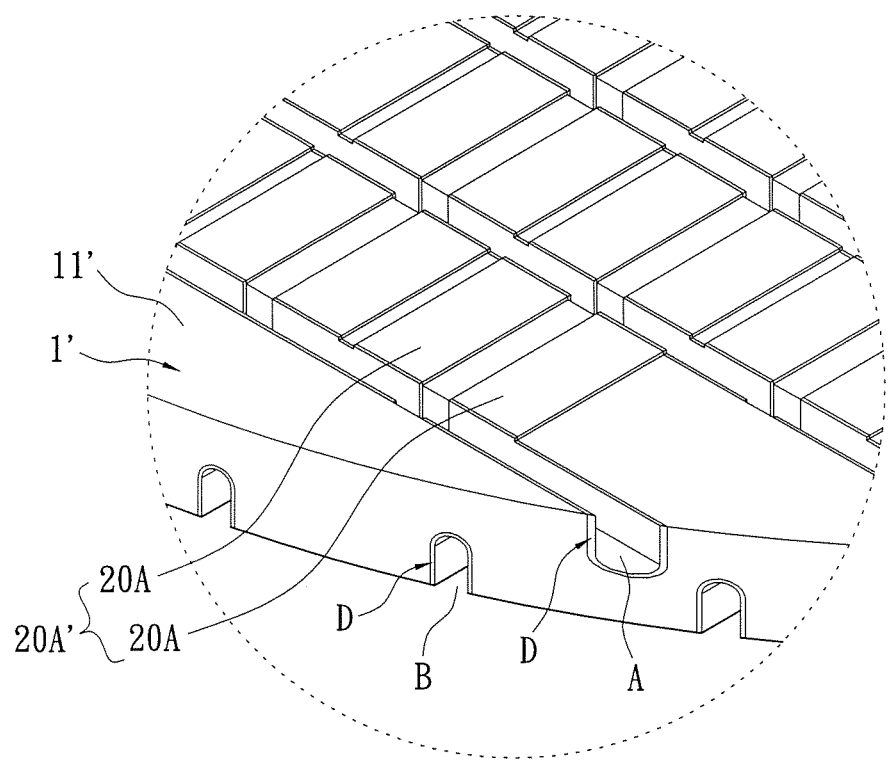
Figure 7A:
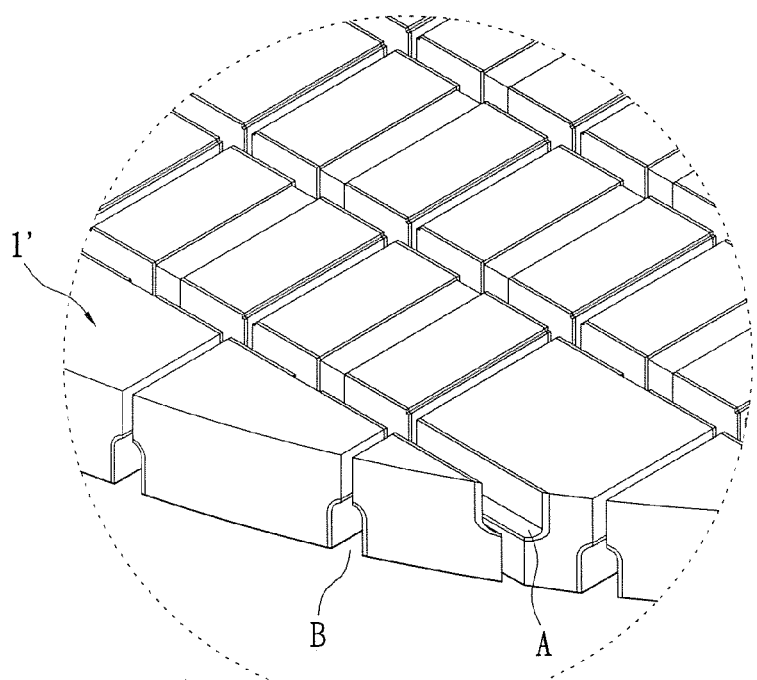
Figure 7B:
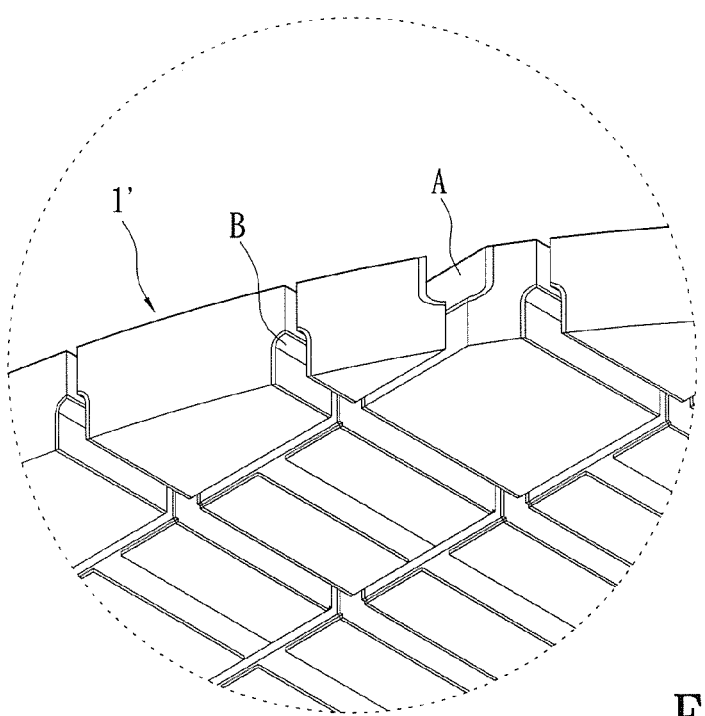

The step S108 is that: referring to FIGS. 1 and 6, removing one part of the conductive material D in the first grooves A. In other words, in the step of S106, the first conductive pads 20A on the top surface 11' of the substrate unit 1' are divided into a plurality of first conductive pad sets 20A', and each first conductive pad set 20A' has at least two first conductive pads 20A. In addition, the part of the conductive material D that is between two first conductive pads 20A of each first conductive pad set 20A' is removed by matching exposure, development, and etching in order to insulate the two first conductive pads 20A of each first conductive pad set 20A' from each other.

Figure 8A:
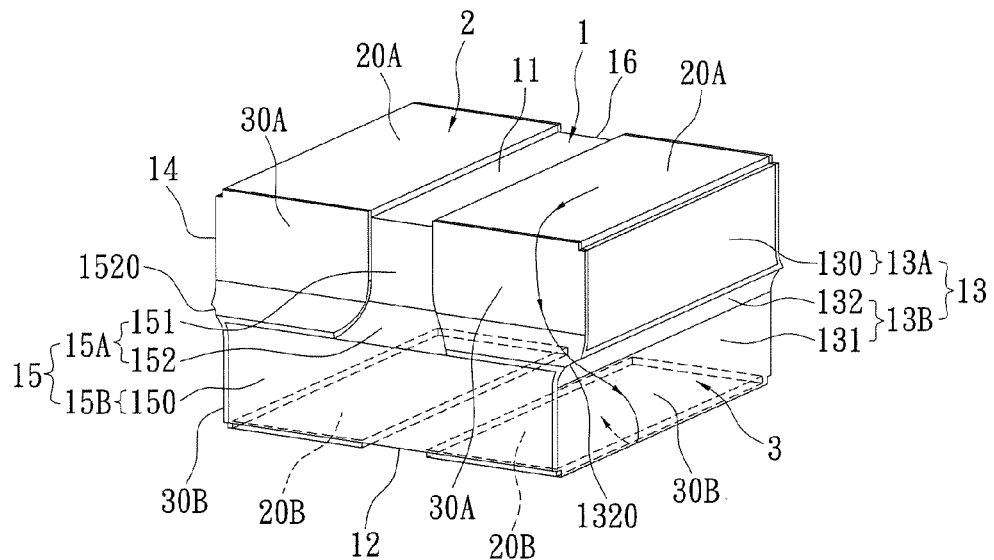
Figure 8B:
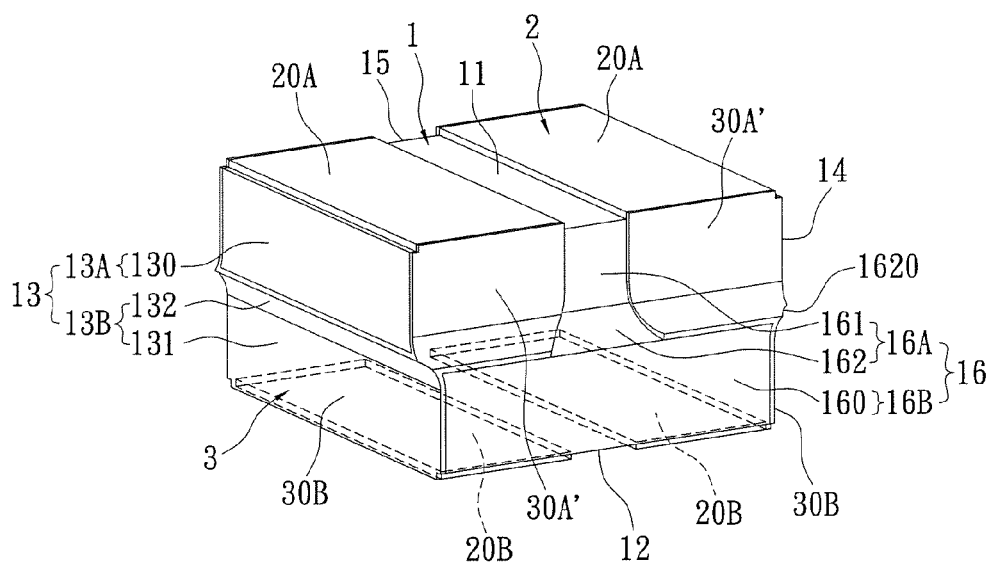

The step S110 is that: referring to FIGS. 1, 7A, 7B, 8A and 8B, cutting the substrate unit 1' along the first grooves A and the second grooves B to form the conductive substrate structures (as shown in FIGS. 8A and 8B). In addition, the substrate unit 1' is cut along the first grooves A and the second grooves B by using a cutting tool (not shown), and the width of the cutting tool is smaller than the widths of the first grooves A and the second grooves B.

Referring to FIGS. 8A and 8B, the present invention provides a conductive substrate structure with conductive channels formed by using a two-sided cut approach, including: a substrate unit 1, a conductive pad unit 2, and a conductive layer unit 3.

The substrate unit 1 has a top surface 11, a bottom surface 12 opposite to the top surface 11, two opposite lateral surfaces 13, 14 between the top surface 11 and the bottom surface 12, and a front surface 15 between the top surface 11 and the bottom surface 12 and on two front sides of the two lateral surfaces 13, 14. In addition, the substrate unit 1 can be an insulative body.

The conductive pad unit 2 has at least two first conductive pads 20A separated from each other and disposed on the top surface 11 of the substrate unit 1, and at least two second conductive pads 20B separated from each other and disposed on the bottom surface 12 of the substrate unit 1. In addition, the two first conductive pads 20A are insulated from each other, and the two second conductive pads 20B are insulated from each other.

Moreover, the conductive layer unit 3 has at least two first conductive layers 30A formed on the front surface 15 of the substrate unit 1 and respectively electrically connected to two front sides of the two first conductive pads 20A, and at least two second conductive layers 30B respectively formed on the two opposite lateral surfaces 13, 14 of the substrate unit 1 and respectively electrically connected to two opposite lateral sides of the two second conductive pads 20B. The two first conductive layers 30A are respectively electrically connected with the two second conductive layers 30B. In addition, one of the two first conductive pads 20A is connected to one of the two second conductive pads 20B by electrically connecting one of the two first conductive layers 30A with one of the two second conductive layers 30B (as the direction of the arrow shown in FIG. 8A), and the other one of the two first conductive pads 20A is connected to the other one of the two second conductive pads 20B by electrically connecting the other one of the two first conductive layers 30A with the other one of the two second conductive layers 30B.

Furthermore, the front surface 15 of the substrate unit 1 is divided into an upper portion 15A and a lower portion 15B. The area of the upper portion 15A of the front surface 15 is larger than that of the lower portion 15B of the front surface 15, and the height of the upper portion 15A of the front surface 15 is smaller than that of the lower portion 15B of the front surface 15. In addition, the lower portion 15B of the front surface 15 is a lower plane 150, the upper portion 15A of the front surface 15 has an upper plane 151 and a cambered face 152 connected between the upper plane 151 and the lower plane 150, and the cambered face 152 has two cambered lines 1520 respectively on two opposite sides thereof. The two first conductive pads 20A are formed on the upper plane 151 and the cambered face 152 of the upper portion 15A of the front surface 15.

Moreover, the lateral surface 13 may be an example as shown in FIG. 8A, each lateral surface 13 of the substrate unit 1 is divided into an upper portion 13A and a lower portion 13B. The area of upper portion 13A of each lateral surface 13 is smaller than that of the lower portion 13B of each lateral surface 13, and the height of upper portion 13A of each lateral surface 13 is larger than that of the lower portion 13B of each lateral surface 13. In addition, the upper portion 13A of each lateral surface 13 is an upper plane 130, the lower portion 13B of each lateral surface 13 has a lower plane 131 and a cambered face 132 connected between the lower plane 131 and the upper plane 130, and the cambered face 132 has two cambered lines 1320 respectively on two opposite sides thereof. Each second conductive layer 30B is formed on the lower plane 131 and the cambered face 132 of the lower portion 13B of each lateral surface 13.

Furthermore, the lateral surface 14 may be an example as shown in FIG. 8a, each lateral surface 14 of the substrate unit 1 is divided into an upper portion and a lower portion. The area of upper portion of each lateral surface 14 is smaller than that of the lower portion of each lateral surface 14, and the height of upper portion of each lateral surface 14 is larger than that of the lower portion of each lateral surface 14. In addition, the upper portion of each lateral surface 14 is an upper plane, the lower portion of each lateral surface 14 has a lower plane and a cambered face connected between the lower plane and the upper plane, and the cambered face has two cambered lines respectively on two opposite sides thereof. Each second conductive layer 30B is formed on the lower plane and the cambered face of the lower portion of each lateral surface 14.

In addition, the substrate unit 1 has a rear surface 16 between the top surface 11 and the bottom surface 12 and on two rear sides of the two lateral surfaces 13, 14. The rear surface 16 is opposite to the front surface 15. The conductive layer unit 3 has at least two another first conductive layers 30A' formed on the rear surface 16 of the substrate unit 1 and respectively electrically connected to two rear sides of the two first conductive pads 20A, and the above-mentioned another two first conductive layers 30A' are respectively electrically connected with the two second conductive layers 30B.

Furthermore, referring to FIG. 8B, the rear surface 16 of the substrate unit 1 is divided into an upper portion 16A and a lower portion 16B. The area of the upper portion 16A of the rear surface 16 is larger than that of the lower portion 16B of the rear surface 16, and the height of the upper portion 16A of the rear surface 16 is smaller than that of the lower portion 16B of the rear surface 16. In addition, the lower portion 16B of the rear surface 16 is a lower plane 160, the upper portion 16A of the rear surface 16 has an upper plane 161 and a cambered face 162 connected between the upper plane 161 and the lower plane 160, and the cambered face 162 has two cambered lines 1620 respectively on two opposite sides thereof. The above-mentioned another two first conductive pads 30A' are formed on the upper plane 161 and the cambered face 162 of the upper portion 16A of the rear surface 16.

Referring to FIGS. 9A to 9D, the present invention provides another method for manufacturing the conductive substrate structures by using V-cutting tool.

Figure 9A:
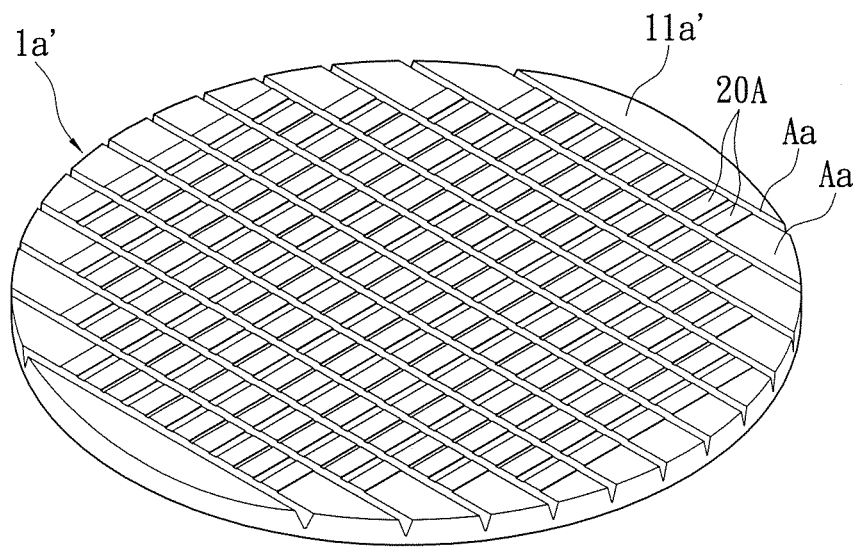
FIGS. 9A to 9D are schematic views of the conductive substrate structure with conductive channels formed by using a V-cutting tool according to the present invention, at different stages of the manufacturing processes, respectively.

Referring to FIG. 9A, cutting the top surface 11a' of the substrate unit 1a' by using a V-cutting tool to form a plurality of first grooves Aa with V shape on the top surface 11a' of the substrate unit 1a'. In addition, the depth of each first groove Aa is larger than ½ thickness of the substrate unit 1a', and the first grooves Aa are respectively formed on two lateral sides of each row of the first conductive pads 20A.

Figure 9B:
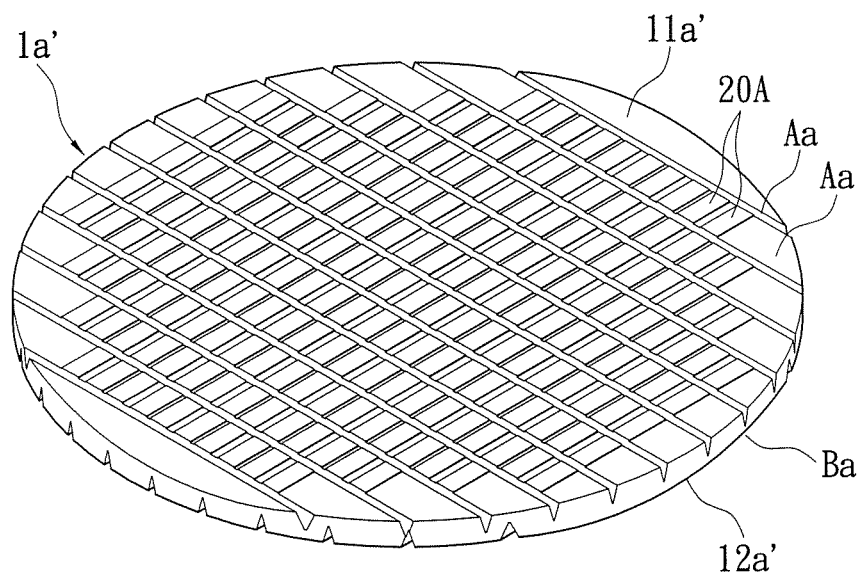

Referring to FIG. 9B, cutting the bottom surface 12a' of the substrate unit 1a' by using a V-cutting tool to form a plurality of second grooves Ba with V shape on the bottom surface 12a' of the substrate unit 1a', and each first groove Aa and each second groove Ba are joined with each other to form an opening (not shown). In addition, the depth of each second groove Ba is larger than ½ thickness of the substrate unit 1a', and the second grooves Ba are respectively formed on two lateral sides of every two rows of the second conductive pads (not shown).

Figure 9C:
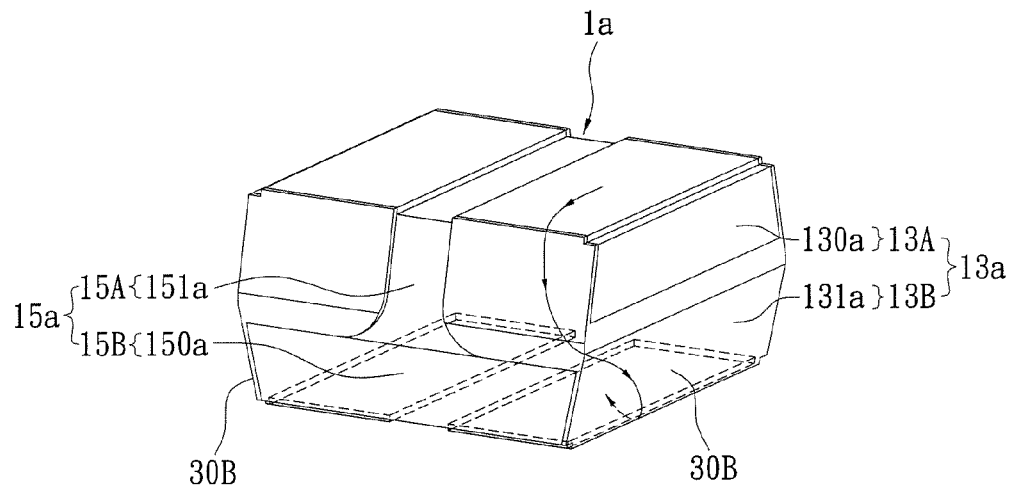

Referring to FIG. 9C, the front surface 15a of the substrate unit 1a is divided into an upper portion 15A and a lower portion 15B. The area of the upper portion 15A of the front surface 15a is larger than that of the lower portion 15B of the front surface 15a, and the height of the upper portion 15A of the front surface 15a is smaller than that of the lower portion 15B of the front surface 15a. In addition, the lower portion 15B of the front surface 15a has a lower inclined face 150a, and the upper portion 15A of the front surface 15a has an upper inclined face 151a.

Moreover, the lateral surface 13a may be an example as shown in FIG. 9C, each lateral surface 13a of the substrate unit 1a is divided into an upper portion 13A and a lower portion 13B. The area of upper portion 13A of each lateral surface 13a is smaller than that of the lower portion 13B of each lateral surface 13a, and the height of upper portion 13A of each lateral surface 13a is larger than that of the lower portion 13B of each lateral surface 13a. In addition, the upper portion 13A of each lateral surface 13a has an upper inclined face 130a, and the lower portion 13B of each lateral surface 13a has a lower inclined face 131a. Each second conductive layer 30B is formed on the lower inclined face 131a of the lower portion 13B of each lateral surface 13a.

Figure 9D:
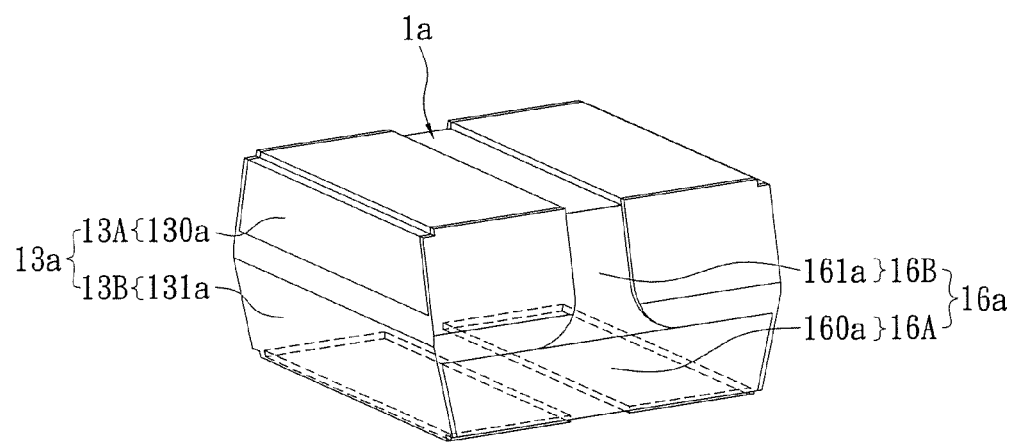

In addition, referring to FIG. 9D, the rear surface 16a of the substrate unit 1a is divided into an upper portion 16A and a lower portion 16B. The area of the upper portion 16A of the rear surface 16a is larger than that of the lower portion 16B of the rear surface 16a, and the height of the upper portion 16A of the rear surface 16a is smaller than that of the lower portion 16B of the rear surface 16a. In addition, the lower portion 16B of the rear surface 16a has a lower inclined face 160a, and the upper portion 16A of the rear surface 16a has an upper inclined face 161a.

Therefore, the method of using laser or machine to drill a substrate to form a plurality of through holes according to the prior art is replaced by the method of cutting the substrate unit by using a U-cutting tool or a V-cutting tool to form the openings according to the present invention.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A method for manufacturing conductive substrate structures with conductive channels formed by using a two-sided cut approach, comprising:
   providing a substrate unit, wherein the substrate unit has a plurality of first conductive pads separated from each other and disposed on a top surface thereof, and a plurality of second conductive pads separated from each other and disposed on a bottom surface thereof;
   cutting the top surface of the substrate unit to form a plurality of first grooves on the top surface of the substrate unit;
   cutting the bottom surface of the substrate unit to form a plurality of second grooves on the bottom surface of the substrate unit, wherein each first groove and each second groove are joined with each other to form an opening;
   forming a conductive material in the first grooves, the second grooves, and the openings;
   removing one part of the conductive material in the first grooves; and
   cutting the substrate unit along the first grooves and the second grooves to form the conductive substrate structures;
   wherein each conductive substrate structure comprises:
   a substrate unit having a top surface, a bottom surface opposite to the top surface, two opposite lateral surfaces between the top surface and the bottom surface, and a front surface between the top surface and the bottom surface and on two front sides of the two lateral surfaces;
   a conductive pad unit having at least two first conductive pads separated from each other and disposed on the top surface of the substrate unit, and at least two second conductive pads separated from each other and disposed on the bottom surface of the substrate unit; and a conductive layer unit having at least two first conductive layers formed on the front surface of the substrate unit and respectively electrically connected to two front sides of the two first conductive pads, and at least two second conductive layers respectively formed on the two opposite lateral surfaces of the substrate unit and respectively electrically connected to two opposite lateral sides of the two second conductive pads, wherein the two first conductive layers are respectively electrically connected with the two second conductive layers.

2. The method according to claim 1, wherein the depth of each first groove is larger than ½ thickness of the substrate unit, and the depth of each second groove is larger than ½ thickness of the substrate unit.

3. The method according to claim 1, wherein the step of removing one part of the conductive material in the first grooves further comprises:
- dividing the first conductive pads on the top surface of the substrate unit into a plurality of first conductive pad sets, wherein each first conductive pad set has at least two first conductive pads; and
- removing the part of the conductive material between two first conductive pads of each first conductive pad set in order to insulate the two first conductive pads of each first conductive pad set from each other.

4. The method according to claim 1, wherein the substrate unit is cut along the first grooves and the second grooves by using a cutting tool, and the width of the cutting tool is smaller than the widths of the first grooves and the second grooves.

* * * * *